United States Patent
Heinrich et al.

(10) Patent No.: US 8,716,079 B2
(45) Date of Patent: May 6, 2014

(54) SUPERIOR FILL CONDITIONS IN A REPLACEMENT GATE APPROACH BY CORNER ROUNDING BASED ON A SACRIFICIAL FILL MATERIAL

(75) Inventors: Jens Heinrich, Wachau (DE); Fernando Koch, Bitterfeld (DE); Johann Steinmetz, Koenigsbrunn (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 381 days.

(21) Appl. No.: 12/891,403

(22) Filed: Sep. 27, 2010

(65) Prior Publication Data
US 2011/0073920 A1 Mar. 31, 2011

(30) Foreign Application Priority Data
Sep. 30, 2009 (DE) .......................... 10 2009 047 890

(51) Int. Cl.
*H01L 21/8238* (2006.01)
(52) U.S. Cl.
USPC ................... 438/199; 438/596; 257/E21.444; 257/E21.453

(58) Field of Classification Search
USPC ............ 438/199, 596; 257/E21.444, E21.453
See application file for complete search history.

(56) References Cited

U.S. PATENT DOCUMENTS

| | | | |
|---|---|---|---|
| 6,210,999 B1 * | 4/2001 | Gardner et al. ............... | 438/183 |
| 8,138,038 B2 * | 3/2012 | Heinrich et al. .............. | 438/199 |
| 2004/0097090 A1 * | 5/2004 | Mimura et al. ............... | 438/709 |
| 2008/0185637 A1 * | 8/2008 | Nagaoka et al. .............. | 257/327 |

OTHER PUBLICATIONS

Translation of Official Communication from German Patent Office for German Patent Application No. 10 2009 047 890.6 dated Nov. 3, 2010.

* cited by examiner

*Primary Examiner* — Stephen W Smoot
*Assistant Examiner* — Vicki B Booker
(74) *Attorney, Agent, or Firm* — Amerson Law Firm, PLLC

(57) ABSTRACT

In a replacement gate approach, a top area of a gate opening may receive a superior cross-sectional shape on the basis of a material erosion process, wherein a sacrificial material may protect sensitive materials, such as a high-k dielectric material, in the gate opening. In one illustrative embodiment, the sacrificial material may be applied after depositing a work function adjusting species in the gate opening.

11 Claims, 7 Drawing Sheets

SUPERIOR FILL CONDITIONS IN A REPLACEMENT GATE APPROACH BY CORNER ROUNDING BASED ON A SACRIFICIAL FILL MATERIAL

BACKGROUND OF THE INVENTION

1. Field of the Invention

Generally, the present disclosure relates to the fabrication of sophisticated integrated circuits including transistor elements comprising gate structures on the basis of a high-k gate dielectric material in combination with a metal electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance, for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

According to this approach, in particular, any threshold variations caused by high temperature processes and the like may be efficiently avoided, thereby contributing to superior uniformity of sophisticated transistor elements. In the replacement gate approach, the polysilicon material is removed on the basis of appropriate etch recipes, such as wet chemical etch processes, which exhibit a high degree of selectivity with respect to the insulating material that laterally delineate the polysilicon material. After the removal of the polysilicon material, an appropriate metal-containing material is deposited in order to form the work function adjusting species above the gate dielectric material as explained above. Typically, P-channel transistors and N-channel transistors require different types of work function adjusting species, which may require a corresponding masking and patterning regime in order to appropriately form the desired work function adjusting material in the gate electrode structures of P-channel transistors and N-channel transistors, respectively. Irrespective of the applied process strategy, after depositing the work function adjusting material layer, at least the actual electrode metal, such as aluminum, has to be filled into the opening, the width of which may, however, be further reduced by the previous deposition of the work function adjusting material, thereby causing significant irregularities, as will be explained with reference to FIGS. 1a-1c.

FIG. 1a schematically illustrates a cross-sectional view of a semiconductor device 100 that comprises a substrate 101, such as a silicon substrate and the like, in or above which is provided a silicon-based semiconductor layer 102. Furthermore, the device 100 comprises a transistor 150, such as a P-channel transistor or an N-channel transistor, that may be formed on the basis of critical dimensions of approximately 40 nm and less. Furthermore, a further circuit element 160, such as a field effect transistor, a capacitor and the like, is provided in the semiconductor device 100 and may be formed on the basis of a greater critical dimension. The transistor 150 comprises drain and source regions 151, possibly in combination with metal silicide regions 152. Similarly, the circuit element 160 comprises "drain and source" regions 161 in combination with metal silicide regions 162. Furthermore, the transistor 150 comprises a gate electrode structure 155 which, in the manufacturing stage shown, includes a gate dielectric material 155A formed on the basis of a high-k dielectric material, as discussed above. Furthermore, a sidewall spacer structure 155C is provided and defines an opening 155O having a width that substantially corresponds to a desired length of the gate electrode structure 155. For example, a width of the opening 155O may be 40 nm and less in sophisticated applications. Similarly, the circuit element 160 may comprise a "gate electrode structure" 165 including a gate dielectric material 165A, a spacer structure 165C, which defines an opening 165O. In principle, the gate electrode structures 155, 165 may have the same configuration except for a different width of the opening 165O compared to the opening 155O. Furthermore, a dielectric material 103, for instance in the form of silicon nitride, silicon dioxide and the like, is provided so as to laterally enclose the gate electrode structures 155, 165.

The semiconductor device 100 as illustrated in FIG. 1a may be formed on the basis of the following process techniques. After forming appropriate semiconductor regions in the layer 102, for instance by providing isolation structures (not shown) for receiving the circuit elements 150, 160, the gate dielectric materials 155A, 165A may be formed on the basis of oxidation and/or sophisticated deposition techniques, wherein, typically, a high-k dielectric material is incorporated in the dielectric materials 155A, 165A. For instance, a silicon oxide-based material may frequently be used as a base layer, possibly in combination with other species, such as nitrogen, on which an appropriate high-k dielectric material, such as hafnium oxide and the like, may be deposited. Thereafter, a conductive cap material may be formed in order to enhance integrity of the gate dielectric materials 155A, 165A during the further processing. Thereafter, polysilicon material is deposited on the basis of well-established process recipes, possibly in combination with further cap materials, hard mask materials and the like, as is required for patterning the resulting material layer stack in accordance with the design rules so as to reliably implement the critical dimensions for the gate electrode structure 155. Thereafter, sophisticated patterning processes are applied in order to obtain the gate electrode structures 155, 165, which include the polysilicon material as a placeholder material. Next, the drain and source regions 151, 161 may be formed in combination with the sidewall spacer structures 155C, 165C in order to obtain the desired dopant profile. Furthermore, the spacer structures 155C, 165C may also be used for forming the metal silicide regions 152, 162, thereby completing the basic configuration of the circuit elements 150, 160. Next, the dielectric material 103, also referred to as an interlayer dielectric material, is formed, for instance by depositing silicon nitride followed by silicon dioxide and the like. Thereafter, any excess material may be removed and an upper surface of the gate electrode structures 155, 165 is exposed, for instance by a polishing process, such as chemical mechanical polishing (CMP). Next, an etch process, such as a highly selective wet chemical etch process, is performed so as to remove the exposed polysilicon material selectively to the dielectric material 103 and the sidewall spacer structures 155C, 165C, thereby forming the openings 155O, 165O.

FIG. 1b schematically illustrates the semiconductor device 100 with a metal-containing material layer 155D formed on the dielectric material 103 and in the openings 155O, 165O. The material layer 155D comprises one or more layers of different materials, such as titanium nitride, tantalum nitride and the like, wherein an appropriate metal species, such as lanthanum, aluminum and the like, may be incorporated in order to adjust the resulting work function of the gate electrode structures 155, 165. As previously discussed, depending on the overall process strategy, different material layers may be locally provided in transistors of different conductivity type, thereby requiring the deposition of at least one or more material layers, possibly in combination with additional etch processes for selectively removing one or more of these layers from gate electrode structures of transistors which may require a different type of work function metal species. Irrespective of the process strategy applied, the material 155D may be deposited on the basis of sophisticated deposition techniques, such as chemical vapor deposition, physical vapor deposition and the like, so as to form the material layer 155D reliably at least above the gate dielectric materials 155A, 165A with a thickness as required for appropriately positioning the work function metal species at and in the dielectric materials 155A, 165A. During the deposition of the material 155D, a significant variation of the layer thickness may be created, which may be particularly pronounced in an upper portion of the opening 155O of reduced critical dimension. Thus, while a width 155W of the opening 155O at the bottom thereof may be defined by the local layer thickness that is selected so as to obtain the desired coverage of the gate dielectric material 155A, a width 155R at the top of the opening 155O may be significantly reduced due to corresponding overhangs of the layer 155D. On the other hand, the reduced width 165R at the top area of the opening 165O may not substantially affect the further processing of the device 100. On the other hand, the reduced width 155R, which may be 20 nm and even less for an initial width of the opening 155O of approximately 40 nm, may result in significant irregularities during the further processing when filling in an actual electrode material into the openings 155O, 165O.

FIG. 1c schematically illustrates the semiconductor device 100 after the deposition of an electrode metal 155E, such as aluminum and the like, in order to complete the gate electrode structures 155, 165. Due to the reduced width 155R (FIG. 1b), the opening 155O may not be completely filled, or the opening 155O may even remain substantially non-filled, thereby producing a non-functional gate electrode structure for the transistor 150. On the other hand, the opening 165O may be reliably filled due to the less critical width of the opening 165O. Consequently, upon removing any excess material, the gate electrode structures 155, 165 may be completed, however, with a very pronounced probability of creating non-functional gate electrode structures for critical transistor elements, such as the transistor 150. Thus, although, in principle, the adjustment of the work function of the gate electrode structure 150 in a very advanced manufacturing stage may be advantageous in view of reducing transistor variability in terms of threshold voltage variations, in particular highly scaled transistor elements may suffer from an increased yield loss due to incompletely filled gate electrode structures or non-functional gate electrode structures.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which a conductive gate electrode material may be filled into an opening of a gate electrode structure on the basis of a superior cross-sectional shape of the opening after the removal of the placeholder material. For this purpose, a less critical width at a top area of the opening may be provided by an appropriate treatment, such as a plasma assisted etch process, a particle bombardment and the like, wherein, at the same time, the bottom of the opening may be protected by a sacrificial material, such as an organic material, which may then be efficiently removed without unduly affecting sensitive materials, such as a high-k dielectric material and the like. In some illustrative embodiments, the superior cross-sectional shape of the opening may be produced after the deposition of one or more material layers including a work function adjusting species.

One illustrative method disclosed herein comprises forming an opening in a gate electrode structure of a transistor by removing a placeholder electrode material of the gate electrode structure. The method further comprises forming a metal-containing material layer on sidewalls and above a bottom of the opening, wherein the metal-containing material layer reduces an initial width of the opening. Additionally, the method comprises filling a sacrificial material in the opening so as to cover the metal-containing material layer at least at the bottom. Furthermore, a reduced width of the opening is increased at a top area thereof in the presence of at least a portion of the sacrificial material. Moreover, the sacrificial material is removed from the opening and a conductive electrode material is filled into the opening.

A further illustrative method comprises forming an opening in a gate electrode structure of a transistor by removing a placeholder electrode material of the gate electrode structure. Moreover, a sacrificial material is filled in the opening so as to cover at least a bottom of the opening. The method further comprises increasing a width of the opening at a top area thereof in the presence of at least a portion of the sacrificial material. The method further comprises removing the at least a portion of the sacrificial material and filling a conductive electrode material in the opening after the removal of the at least a portion of the sacrificial material.

One illustrative semiconductor device disclosed herein comprises a gate electrode structure of a transistor formed above a semiconductor region. The gate electrode structure comprises a gate insulation layer including a high-k dielectric material and comprises an electrode material that is formed on the gate insulation layer and has a tapered cross-sectional configuration. The gate electrode structure further comprises a work function adjusting material layer formed on at least a portion of sidewalls of the electrode material, wherein a thickness of the work function adjusting material layer is minimal at a top area of the gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
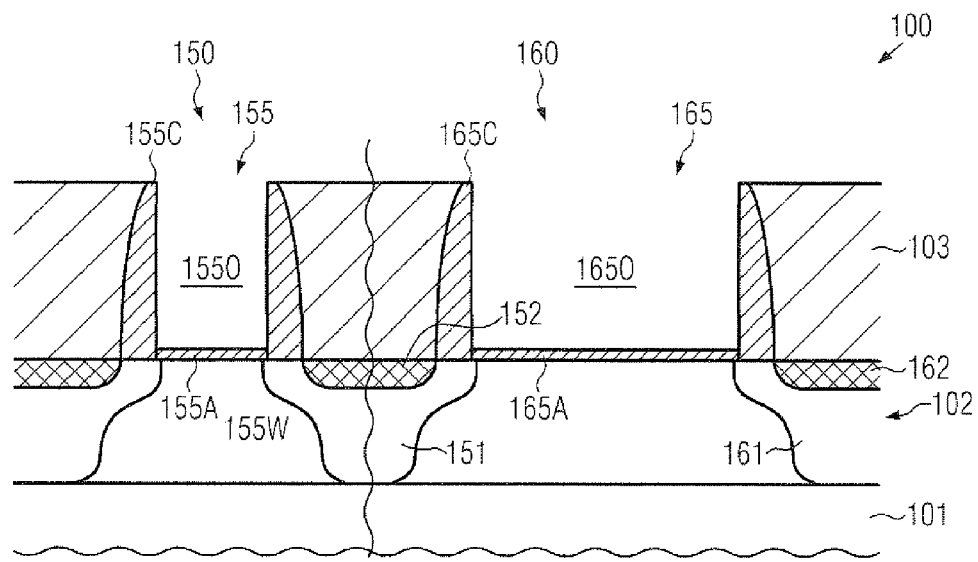
FIGS. 1a-1c schematically illustrate cross-sectional views of a semiconductor device during various manufacturing stages in replacing a polysilicon material with an electrode metal in combination with a work function adjusting species on the basis of conventional approaches.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which a sacrificial material, such as an organic material, may be efficiently used to protect the bottom area of a gate opening upon increasing the top width after removing a placeholder electrode material. Consequently, further materials, such as a work function adjusting species and, in particular, the actual electrode material, may be filled into the gate opening on the basis of a superior cross-sectional shape thereof, thereby avoiding or at least reducing the occurrence of deposition-related irregularities, such as non-filled gate electrodes or incompletely filled gate electrode structures. In some illustrative aspects disclosed herein, any materials, such as conductive barrier layers, etch stop layers and the like, in combination with the work function adjusting species, may be deposited within the gate opening after removing the placeholder electrode material, wherein a disadvantageous reduction of the width of the gate opening at a top area thereof may be "corrected" on the basis of a subsequent treatment, such as a plasma assisted etch process, a particle bombardment, such as ion sputtering, and the like, while at the same time the sacrificial material may protect at least the bottom area of the gate opening and may thus efficiently protect the previously deposited materials. Thereafter, the removal of the sacrificial material may be accomplished on the basis of well-established etch techniques, which typically may have a high degree of selectivity with respect to the sensitive materials previously deposited so that the sacrificial material may be efficiently removed without unduly affecting the underlying materials. For example, a plurality of polymer materials, which may be applied in a low viscous state, are available, for instance, such materials may frequently be used as "optical planarization layers" in critical lithography processes and the like. Consequently, such materials may be applied with a high degree of gap fill capability, while at the same time providing a substantially uniform height level across large areas of the semiconductor substrate. On the other hand, such materials may be readily removed, for instance, by plasma strip processes, wet chemical etch recipes and the like. In some illustrative embodiments, these materials may be removed by radiation treatment, for instance based on laser radiation, flash lamp radiation and the like, in order to "evaporate" the sacrificial material with a minimal effect on underlying materials, such as a work function adjusting species and the like.

In other illustrative embodiments, the increase of width at a top area of the gate opening, which may also be referred to as corner rounding or tapering of the gate opening, may be applied prior to depositing critical material systems in the gate opening, wherein the sacrificial material may also efficiently protect the underlying gate dielectric material or any other conductive cap materials formed thereon when initiating a certain degree of material erosion, for instance, by a plasma assisted etch process, ion sputtering and the like.

Figure 1B:
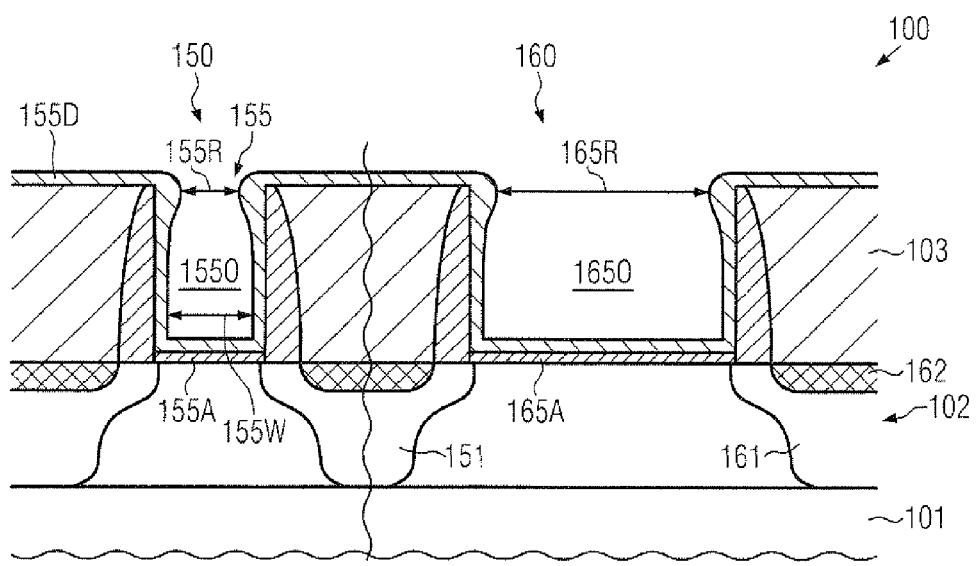
Figure 1C:
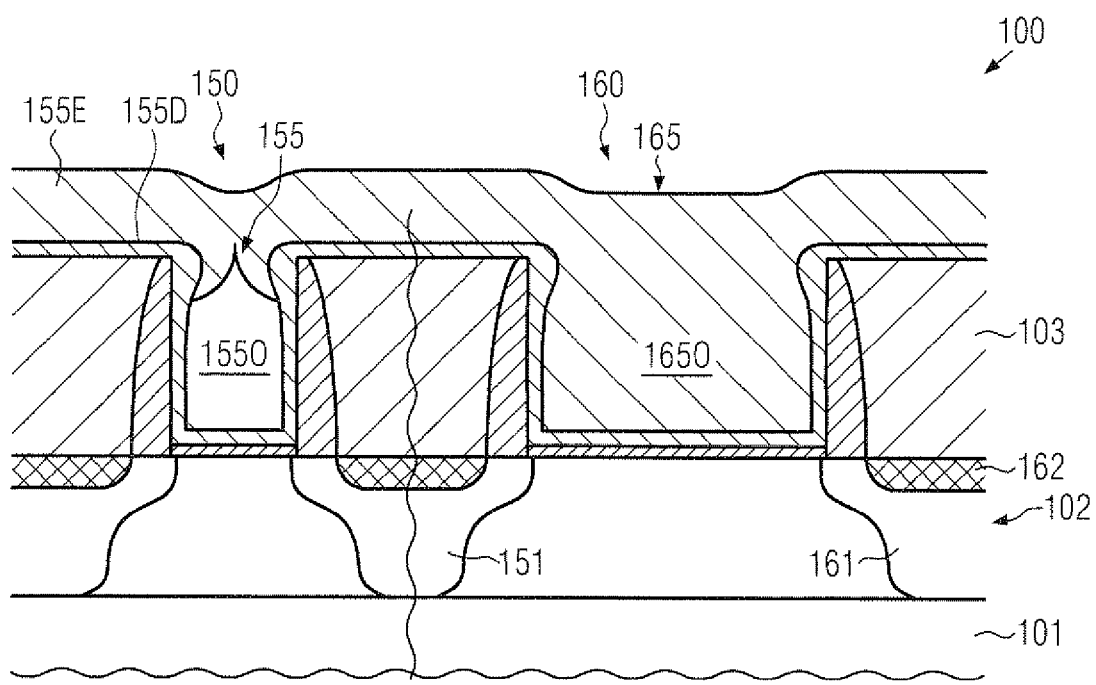

With reference to FIGS. 2a-2k, further illustrative embodiments will now be described in more detail, wherein reference may also be made to FIGS. 1a-1c, if appropriate.

Figure 2A:
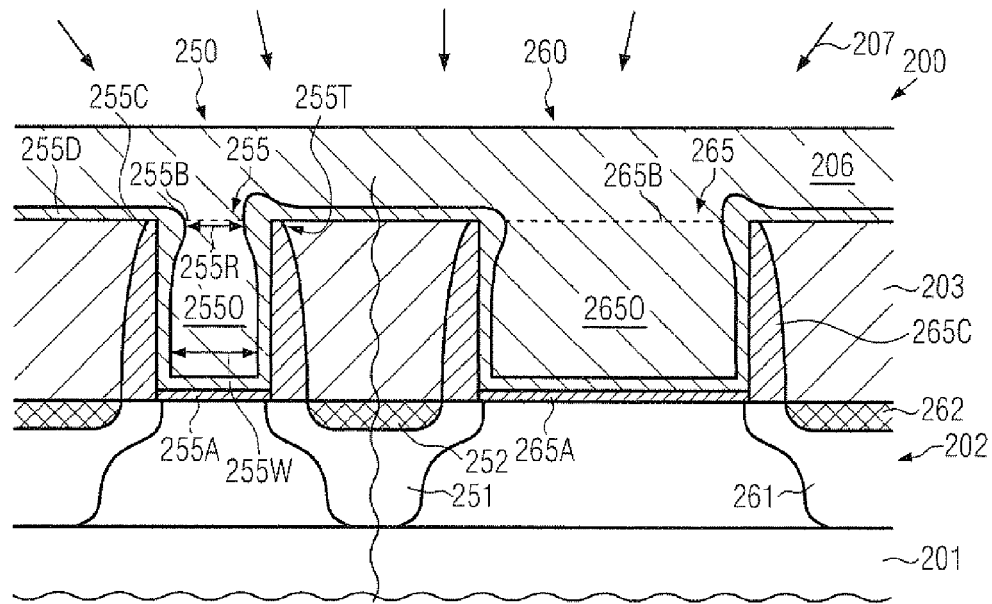
FIGS. 2a-2g schematically illustrate cross-sectional views of a semiconductor device during various manufacturing stages in which a conductive electrode material is filled in an opening having formed therein a work function adjusting material layer with superior cross-sectional shape obtained on the basis of a sacrificial material, according to illustrative embodiments.

FIG. 2a schematically illustrates a cross-sectional view of a semiconductor device 200 comprising a substrate 201, above which may be formed a semiconductor layer 202. The substrate 201 in combination with the semiconductor layer 202 may represent any appropriate material system for forming therein and thereabove circuit elements, such as a transistor 250 and other circuit elements 260, which may represent transistors, capacitors and the like. In the embodiment shown, the transistor 250 may be formed on the basis of critical dimensions that may be less than critical dimensions of the circuit element 260, as is also previously discussed with reference to the semiconductor device 100. Furthermore, the substrate 201 and the layer 202 may represent an SOI configuration when a buried insulating layer (not shown) is formed below the semiconductor layer 202. As previously explained, typically, the semiconductor material 202 may be comprised of silicon or silicon/germanium since most of the highly complex semiconductor devices are formed on the basis of silicon. It should be appreciated, however, that any other material systems may be applied if considered appropriate for obtaining the desired circuit performance.

As also previously discussed with reference to the semiconductor device 100, the transistor 250 may comprise drain and source regions 251, possibly in combination with metal silicide regions 252, and similarly the circuit element 260 may comprise "drain and source" regions 261 in combination with metal silicide regions 262. Furthermore, the transistor 250 may comprise a gate electrode structure 255 which may comprise, in the manufacturing stage shown, a gate dielectric material 255A, possibly in combination with a conductive cap material, a spacer structure 255C and one or more material layers 255D comprising a metal species in order to adjust the work function of the gate electrode structure 255. Similarly, the circuit element 260 may comprise a "gate electrode structure" 265 having the components 265A, 265C and 255D. Furthermore, corresponding openings 255O, 265O may be provided in the structures 255, 265 and may be filled with a sacrificial material 206. The sacrificial material is to be removed in a later manufacturing stage and may be provided in the form of a material having desired deposition capabilities and may be removable on the basis of very selective etch recipes without unduly affecting the material system 255C. For instance, a plurality of "optical planarization materials" are available and may be used as the sacrificial material 206. An appropriate material system may readily be identified by performing test runs for different material compositions in order to determine the deposition characteristics and the etch behavior when exposed to plasma etch recipes, ion sputtering techniques and the like. Furthermore, the removal characteristics may also be determined on the basis of experiments so as to determine appropriate material compositions and etch recipes for removing remaining portions of the sacrificial material 206 without unduly affecting the underlying materials.

The semiconductor device 200 may be formed on the basis of the following processes. The circuit elements 250, 260 may be fabricated on the basis of any appropriate process strategy, as is, for instance, also described above when referring to the semiconductor device 100. That is, after forming an interlayer dielectric material 203 so as to enclose the gate electrode structures 255, 265, a surface of these components may be exposed by any appropriate process technique and thereafter a placeholder electrode material, schematically indicated as 255B, 265B, such as polysilicon, silicon/germanium and the like, possibly in combination with additional cap materials and the like, may be removed on the basis of well-established etch techniques. Next, the material layer or layers 255D may be deposited, for instance, in the form of titanium nitride, tantalum nitride and the like, thereby reducing an initial width of the openings 255O, 265O since a corresponding layer thickness may be required so as to at least cover the material 255A in the critical opening 255O. It should be appreciated that the material 255D may comprise any appropriate metal species for adjusting the work function of the transistor 250, which may depend on the conductivity type of the transistor 250. For this purpose, an appropriate thin layer may be deposited within the layer 255D so as to initiate an interdiffusion of the corresponding metal species in a later manufacturing stage. Irrespective of the actual configuration of the layer 255D, a significant reduction of the initial width of the opening 255O, as indicated by 255R, may be caused due to any overhangs at the top area 255T of the gate electrode structure 255, as previously discussed with reference to the device 100. After the deposition of the material layer or layers 255D, the sacrificial material 206 may be provided, for instance, by depositing a polymer material in a low viscous state on the basis of spin coating techniques, wherein the appropriately selected gap fill capabilities may result in an efficient filling of the opening 255O. For example, a certain degree of overfill of the openings 255O, 265O may be achieved while also a substantially planar surface topography may be obtained. After any further treatment of the layer 206, for instance by performing a heat treatment and/or a treatment based on radiation and the like, the desired material characteristics may be adjusted, for instance, in view of chemical resistivity during the further processing of the device 200 when increasing the reduced width 255R so as to obtain superior conditions when filling an electrode material into the opening 255O. Next, an etch ambient or any other removal process, such as a polishing process, as will be described later on in more detail, may be performed so as to expose the top area 255T. As illustrated, an etch process 207, for instance in the form of a wet chemical etch process, a plasma assisted etch process and the like, may be performed to remove an excess portion of the layer 206.

Figure 2B:
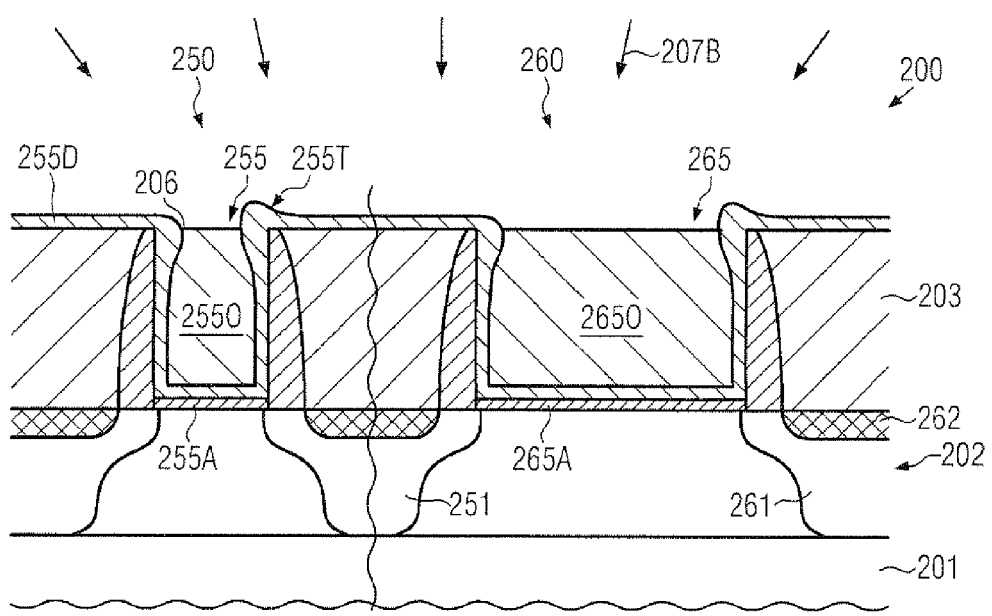

FIG. 2b schematically illustrates the semiconductor device 200 in a further advanced stage of the etch process 207 (FIG. 2a) or in a separate etch process 207B in which the upper area 255T of the gate electrode structure 255 may be exposed. During the etch process 207B, the material layer 255D may also be etched, while the underlying dielectric material 203 may act as an etch stop material. In other cases, depending on the composition of the layer or layers 255D, material removal of the material 255D may be less pronounced during the etch process 207B so that a desired portion of the top area 255T and thus of the layer 255D may be exposed.

Figure 2C:
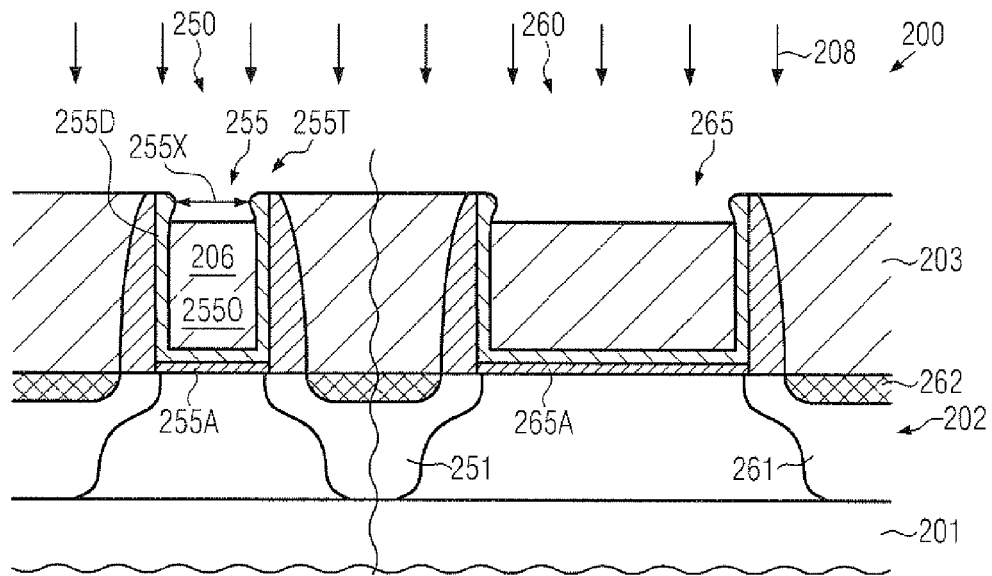

FIG. 2c schematically illustrates the semiconductor device 200 when exposed to a process atmosphere 208 that is appropriately configured to initiate material removal, preferably at the top area 255T, thereby increasing the width of the opening 255O at the top area 255T, as indicated by a width 255X. For this purpose, in some illustrative embodiments, the material removal process 208 may be performed on the basis of a plasma assisted etch recipe in which appropriate reactants based on fluorine, chlorine and the like may be used so as to preferably remove material of the layer 255D, while the removal of the material 203 may be less. Furthermore, during the process 208, a portion of the sacrificial material 206 may also be removed, thereby increasingly exposing an upper portion of sidewalls of the opening 255O.

In other illustrative embodiments, the material removal process 208 may be performed on the basis of an efficient particle bombardment, such as an ion sputter process, which is to be understood as a process for ionizing gas molecules or atoms and accelerating the ionized particles on the basis of an appropriate acceleration system, thereby imparting sufficient kinetic energy to the particles in order to release atoms from a surface layer of exposed portions. In the top area 255T, i.e., at corners of the opening 255O, the overall material removal may be more pronounced compared to horizontal portions due to an increased surface area that is available for incoming energetic ions or neutral particles. Consequently, the width 255X may be increased without unduly removing material from the dielectric material 203, while the remaining portion of the sacrificial material 206 may still reliably protect the material 255D, at least at the bottom of the opening 255O. It should be appreciated that a desired degree of "corner rounding" may be readily obtained by selecting appropriate process parameters of the process 208, which may be accomplished on the basis of experiments using different bombarding species and energies for an ion sputter process in combination with the materials 203 and 255D and the specific geometry provided by the opening 255O.

Figure 2D:
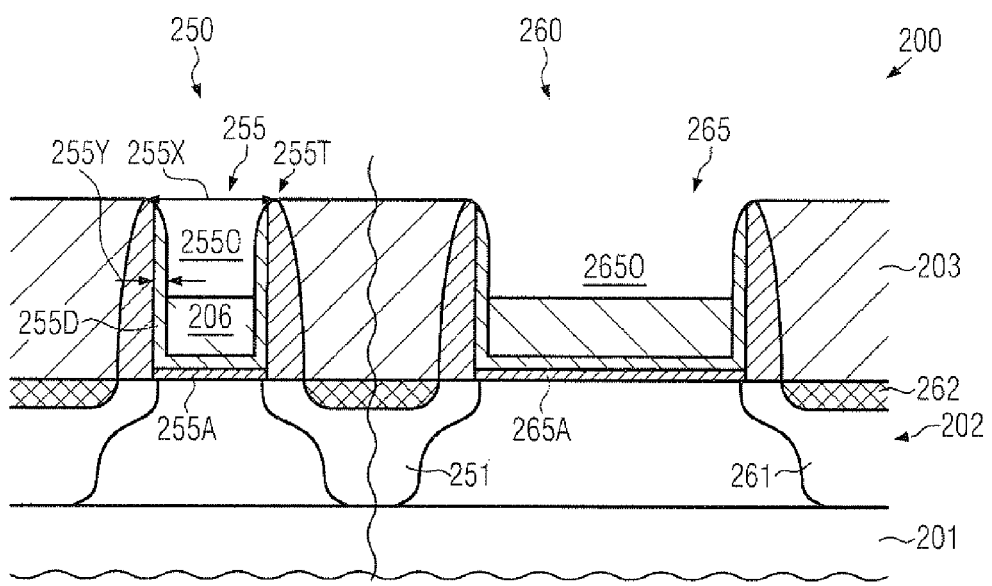

FIG. 2d schematically illustrates the semiconductor device 200 after the end of the material removal process 208 of FIG. 2c. As shown, a desired degree of corner rounding at the top area 255T may be obtained so that an increased width 255X may result in a superior cross-sectional shape of the opening 255O in view of the further processing of the device 200. Moreover, in the manufacturing stage shown, a portion of the sacrificial material 206 may still be in the opening 255O and also in the opening 265O. In the embodiment shown, a thickness 255Y of the material layer 255D may have its minimum in the top area 255T due to the preceding material erosion process 208 of FIG. 2c, wherein the layer 255D may be substantially completely removed in the uppermost portion of the top area 255T, depending on the process parameters of the process 208 (FIG. 2c).

Figure 2E:
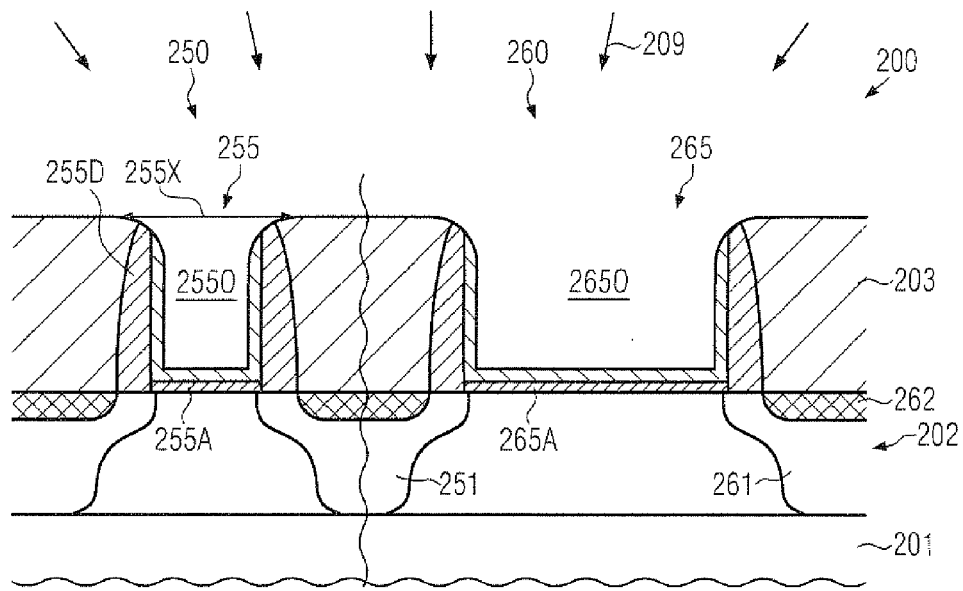

FIG. 2e schematically illustrates the semiconductor device 200 when exposed to a further process ambient 209 in which the remaining portion of the material 206 (FIG. 2d) may be removed from the openings 255O, 265O. As previously discussed, a plurality of organic materials are available which may have high removal rates when exposed to well-known wet chemical or plasma assisted etch processes, while a removal rate for other materials, such as the layer 255D and the dielectric material 203, may be significantly less. For example, during the removal process 209, wet chemical recipes, for instance in the form of TMAH (tetramethyl ammonium hydroxide) and the like, may be applied, depending on the etch resistivity of the layer 255D in order to efficiently remove the sacrificial material. In other cases, oxygen-based plasma processes may be applied so as to remove the remaining portion of the sacrificial material. For this purpose, appropriate recipes may readily be identified on the basis of experiments. In other illustrative embodiments, the removal process 209 may be established on the basis of radiation, such as ultraviolet radiation and the like, or on the basis of any other processes in which sufficient energy may be deposited in the remaining portion of the sacrificial material 206 (FIG. 2d) in order to initiate the evaporation of this material without unduly affecting any other material systems, such as the layer 255D. Also in this case, appropriate radiation sources, such as laser sources, flashlight-based sources and the like, are typically available in semiconductor production facilities.

Figure 2F:
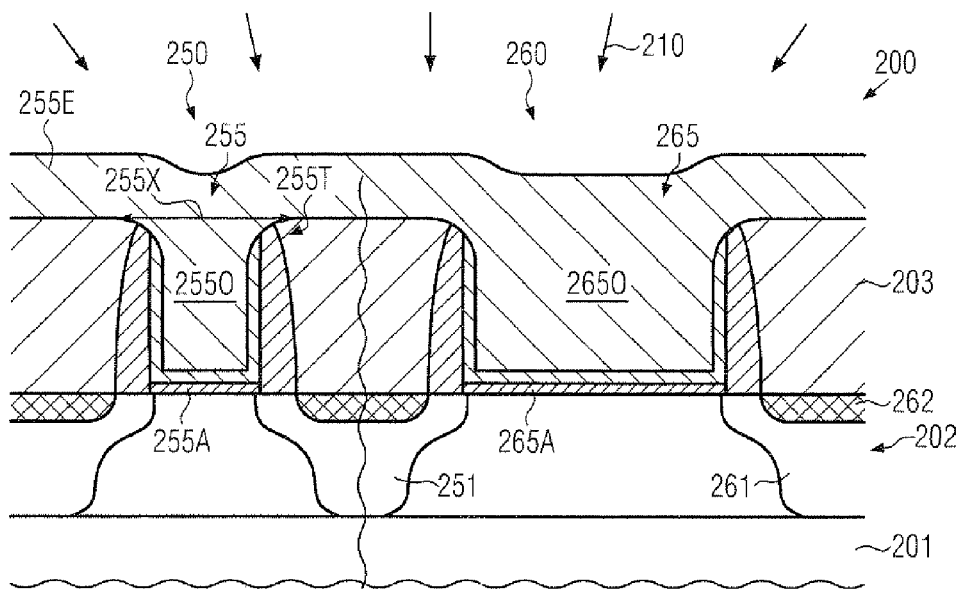

FIG. 2f schematically illustrates the semiconductor device 200 in a further advanced manufacturing stage in which an electrode material 255E, for instance in the form of aluminum or any other appropriate conductive material, is deposited in the openings 255O, 265O on the basis of any appropriate deposition technique 210. For example, sputter deposition techniques, for instance for providing a seed layer, if required, and the like, chemical vapor deposition (CVD) techniques, electrochemical deposition processes, such as electroplating and/or electroless plating, and the like may be applied, possibly in combination, in order to fill the openings 255O, 265O. As previously discussed, due to the superior cross-sectional shape at the top area 255T having the increased width 255X, a reliable filling of the critical opening 255O may be accomplished, thereby significantly enhancing overall product uniformity and also contributing to a higher production yield.

Figure 2G:
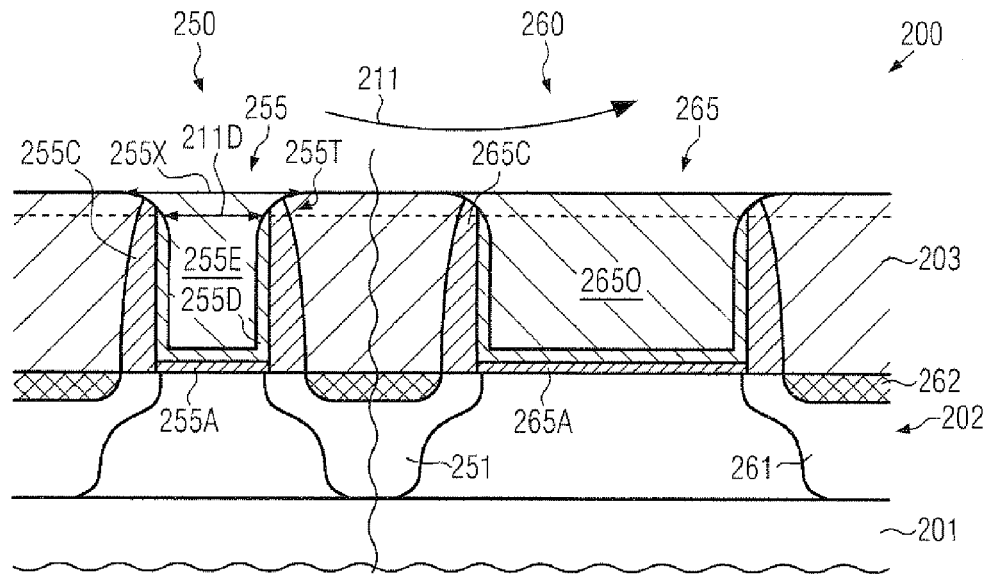

FIG. 2g schematically illustrates the device 200 during a removal process 211, such as a polishing process in the form of a CMP process, in which any excess material may be removed so as to obtain the gate electrode structures 255, 265 including a gate electrode material 255E in combination with the work function adjusting layer or layers 255D and the gate dielectric material 255A comprising a high-k dielectric material, as explained before. During the removal process 211, the dielectric material 203 in combination with the spacer structure 255C and 265C may act as a stop material, if desired, thereby obtaining the previously adjusted increased width 255X at the top area 255T for the critical gate electrode structure 255. In other cases, the removal process 211 may comprise an additional process phase in which a certain degree of material removal, as indicated by 211D, may be initiated in order to reduce the initial width 255X, thereby adjusting the "length" of the gate electrode structure 255 at the top area 255T thereof. A corresponding reduction of the lateral dimension 255X, as indicated by 211D, may be advantageous in densely packed device regions in order to reduce the probability of creating leakage paths or short circuits upon forming contact elements in a later manufacturing stage.

Consequently, the transistor 250 may comprise the gate electrode structure 255 having the superior electrical performance due to the provision of a high-k dielectric material in the layer 255A in combination with the highly conductive material 255E, while the metal-containing material 255D may result in the desired work function. Similar considerations may apply for the gate electrode structure 265.

Figure 2H:
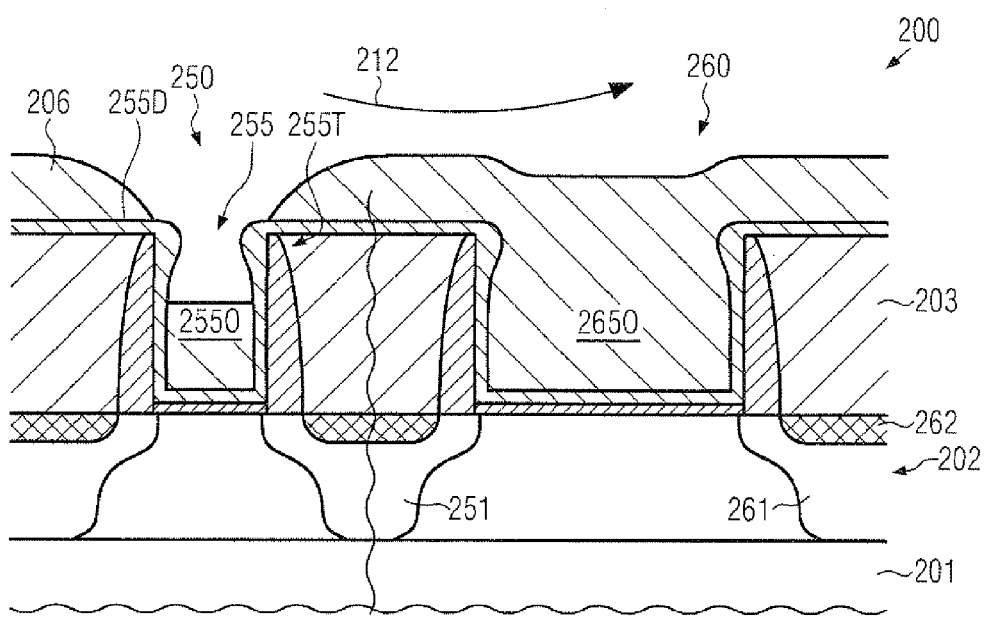
FIG. 2h schematically illustrates a cross-sectional view of the semiconductor device in which a planarization of the sacrificial material may be applied so as to compensate for or reduce deposition-related non-uniformities in wide openings and openings of critical dimensions, according to illustrative embodiments.

FIG. 2h schematically illustrates the semiconductor device 200 in a manufacturing stage in which the sacrificial material 206 may be provided above the transistor 250 and above the circuit element 260. Due to the different lateral dimensions of the openings 255O, 265O, the surface planarity of the material 206 as well as the fill state may be different, as for instance the gap fill capability for the opening 255O may be significantly less pronounced compared to the wide opening 265O. In this case, a planarization process 212 may be performed, for instance, in the form of a CMP process, thereby reducing the surface non-uniformity of the material 206, substantially without contributing to a further material erosion within the opening 255O. Consequently, during the process 212, the material layer 255D may be exposed, thereby also exposing the area 255T. Thereafter a material erosion process, as previously described, may be performed in order to increase the width of the top area 255T, as discussed above. During this process, the material 206 within the opening 255O may still reliably protect the material 255D at the bottom of the opening 255O. In other cases, after planarizing the layer 206, a further deposition of a sacrificial material may be performed, possibly in combination with a further planarization process, thereby increasingly filling the opening 255O, if considered appropriate.

Thus, based on the planarization process 212, deposition-related non-uniformities may be compensated for or at least significantly reduced upon applying the sacrificial material 206, which may enable an increased degree of flexibility in selecting appropriate materials since the gap fill capabilities may be less critical.

Figure 2I:
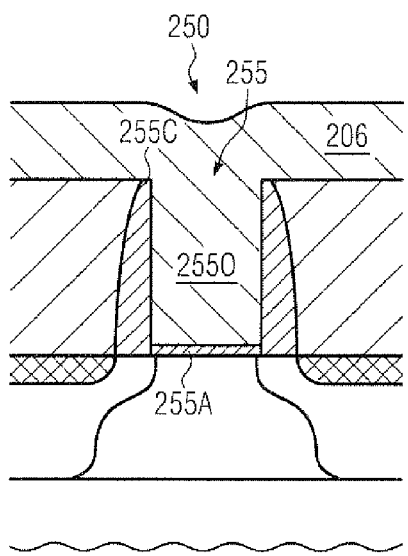
FIGS. 2I-2k schematically illustrate cross-sectional views of the semiconductor device during various manufacturing stages in which a superior cross-sectional shape of the gate opening is obtained on the basis of a sacrificial material that is applied prior to depositing a work function adjusting species, according to further illustrative embodiments.
Figure 2J:
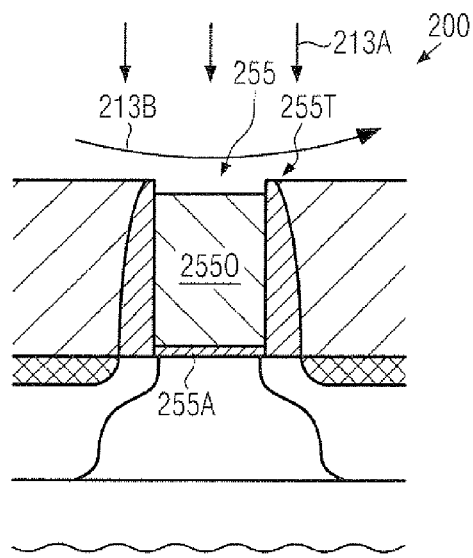
Figure 2K:
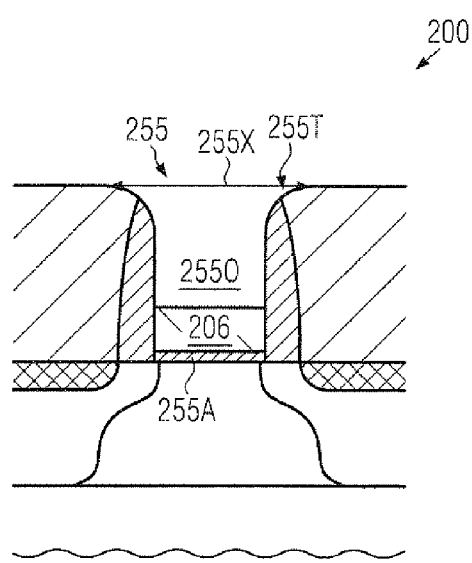

FIGS. 2i-2k schematically illustrate the semiconductor device 200 according to further illustrative embodiments in which the sacrificial material may be applied prior to the deposition of the material 255D.

FIG. 2i schematically illustrates the device 200 in a stage in which the sacrificial material 206 is formed in the opening 255O, which may have its initial width defined by the sidewall spacer structure 255C. That is, the width of the opening 255O may substantially correspond to a design gate length of the gate electrode structure 255. In this case, the sacrificial material 206 may be reliably filled into the opening 255O, thereby also reliably covering the area 255A.

FIG. 2j schematically illustrates the device 200 during a material removal process, which may be based on an etch process 213A or a polishing process 213B, or a combination of these two process techniques. Consequently, during the removal process or processes 213A, 213B, the top area 255T may be exposed, as previously explained, thereby enabling an efficient corner rounding or material erosion process.

FIG. 2k schematically illustrates the semiconductor device 200 in a further advanced manufacturing stage in which the top area 255T may have the increased width 255X, which may be obtained on the basis of any appropriate material erosion process, as is also previously discussed. Furthermore, a remaining portion of the sacrificial material 206 may still reliably protect the material 255A. Thus, during the further processing, the remaining portion 206 may be removed, as discussed before, and the further processing may be continued by depositing one or more materials for adjusting the characteristics of the gate electrode structure 255, for instance by forming one or more metal-containing layers including a work function adjusting species. Due to the superior cross-sectional shape, any reduction of width of the top area 255T may be less critical and thus the subsequent deposition of the actual electrode material may result in a complete filling of the opening 255O.

As a result, the present disclosure provides semiconductor devices and manufacturing techniques in which a sacrificial material may be efficiently used for protecting sensitive materials, such as high-k dielectric materials having a dielectric constant greater than 10.0, work function adjusting materials and the like, during a process for increasing the length of a gate electrode structure at a top area thereof. Consequently, based on the superior cross-sectional form of the gate opening, at least the actual electrode material may be filled with superior process uniformity and reliability. It should be appreciated that the embodiments described above may refer to a gate dielectric material, such as the material 255A, 265A, in which a high-k dielectric material may be incorporated, the characteristics of which may be subsequently adjusted by providing a work function adjusting material in a very late manufacturing stage. In other cases, the gate dielectric material may also be removed at least partially and may be replaced by a high-k dielectric material, wherein the superior cross-sectional shape of the corresponding opening may result in superior deposition conditions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an opening in a gate electrode structure of a transistor by removing a placeholder electrode material of said gate electrode structure, said opening having an initial width and substantially vertically oriented sidewalls;
   forming a metal-containing material layer having an initial thickness on an entirety of said substantially vertically oriented sidewalls and above a bottom of said opening, said metal-containing material layer reducing said initial width of said opening to a reduced width;
   filling said opening with a sacrificial material so as to cover at least a portion of said metal-containing material layer positioned above said bottom;
   reducing said initial thickness of said metal-containing material layer so as to increase said reduced width of said opening at a top area thereof in the presence of at least a portion of said sacrificial material while leaving said metal-containing layer covering substantially the entirety of said substantially vertically oriented sidewalls of said opening;
   removing said sacrificial material from said opening; and
   filling said opening with a conductive electrode material.

2. The method of claim 1, wherein filling said opening with a sacrificial material comprises depositing a material layer so as to overfill said opening and removing excess material of said material layer.

3. The method of claim 2, wherein removing excess material of said material layer comprises performing an etch process.

4. The method of claim 2, wherein removing excess material of said material layer comprises performing a polishing process.

5. The method of claim 1, wherein reducing said initial thickness of said metal-containing material layer so as to increase said reduced width of said opening at a top area thereof comprises performing a plasma assisted etch process.

6. The method of claim 1, wherein forming said metal-containing material layer comprises depositing at least one material layer that contains a metal species for adjusting a threshold voltage of said transistor.

7. The method of claim 6, wherein forming said metal-containing material layer further comprises forming a conductive layer above said at least one material layer comprising said metal species and using said conductive layer as an etch stop material when removing said sacrificial material.

8. The method of claim 1, wherein reducing said initial thickness of said metal-containing material layer so as to increase said reduced width of said opening at a top area thereof comprises performing a polishing process.

9. The method of claim 1, wherein filling a conductive electrode material in said opening comprises depositing a conductive material so as to overfill said opening and removing excess material of said conductive material by performing a polishing process.

10. The method of claim 9, wherein performing said polishing process comprises controlling said polishing process so as to adjust a length of said gate electrode at said top area.

11. The method of claim 9, wherein depositing said conductive electrode material comprises depositing a metal.

* * * * *